(12) United States Patent
Lee et al.

(10) Patent No.: US 10,360,978 B2
(45) Date of Patent: Jul. 23, 2019

(54) SEMICONDUCTOR MEMORY DEVICE FOR PERFORMING CODING PROGRAM AND OPERATING METHOD THEREOF

(71) Applicant: SK hynix Inc., Gyeonggi-do (KR)

(72) Inventors: Hee Youl Lee, Gyeonggi-do (KR); Byeong Kyu Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/873,069

(22) Filed: Jan. 17, 2018

(65) Prior Publication Data
US 2019/0019555 A1 Jan. 17, 2019

(30) Foreign Application Priority Data
Jul. 11, 2017 (KR) .................. 10-2017-0087873

(51) Int. Cl.
*G11C 16/04* (2006.01)
*G11C 16/08* (2006.01)
*G11C 7/18* (2006.01)
*G11C 16/14* (2006.01)
*G11C 16/24* (2006.01)

(52) U.S. Cl.
CPC .......... *G11C 16/0483* (2013.01); *G11C 7/18* (2013.01); *G11C 16/0441* (2013.01); *G11C 16/08* (2013.01); *G11C 16/14* (2013.01); *G11C 16/24* (2013.01)

(58) Field of Classification Search
CPC . G11C 16/08; G11C 16/0425; G11C 16/0483; G11C 16/14; G11C 16/24; G11C 7/18
See application file for complete search history.

(56) References Cited

U.S. PATENT DOCUMENTS

| 7,924,628 B2* | 4/2011 | Danon ................ G11C 11/5628 365/185.22 |
| 2009/0122610 A1* | 5/2009 | Danon ................ G11C 11/5628 365/185.08 |
| 2013/0148427 A1 | 6/2013 | Lee |
| 2015/0179269 A1* | 6/2015 | Lee ........................ G11C 16/14 365/185.03 |

FOREIGN PATENT DOCUMENTS

KR 1020160062498 6/2016

* cited by examiner

*Primary Examiner* — Gene N Auduong
(74) *Attorney, Agent, or Firm* — IP & T Group LLP (57) ABSTRACT

Disclosed are a semiconductor memory device and an operating method thereof. The semiconductor memory device includes: a memory cell array including a plurality of memory blocks sharing one or more drain select lines; a peripheral circuit configured to perform a program operation on the memory cell array; and a control logic configured to control the peripheral circuit to coding-program one or more drain select transistors included in each of the plurality of memory blocks.

20 Claims, 8 Drawing Sheets

SEMICONDUCTOR MEMORY DEVICE FOR PERFORMING CODING PROGRAM AND OPERATING METHOD THEREOF

CROSS-REFERENCE TO RELATED APPLICATION

The present application claims priority under 35 U.S.C. § 119(a) to Korean patent application number 10-2017-0087873 filed on Jul. 11, 2017, the entire disclosure of which is incorporated herein by reference.

BACKGROUND

Field of Invention

Various exemplary embodiments of the present disclosure relate to an electronic device. More particularly, the various embodiments of the present disclosure relate to a semiconductor memory device and an operating method thereof.

Description of Related Art

A semiconductor memory device is generally classified into a volatile memory device and a nonvolatile memory device.

The nonvolatile memory device has a relatively low write and read rate, but maintains stored data even though a power supply is blocked. Accordingly, the nonvolatile memory device is used in order to store data which needs to be maintained regardless of the power supply. The nonvolatile memory device includes a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

The flash memory has an advantage of the RAM, in which data is freely programmed and erased, and an advantage of the ROM, in which stored data can be maintained even though a power supply is blocked. The flash memory is widely used as a storage medium of a portable electronic device, such as a digital camera, a Personal Digital Assistant (PDA), an MP3 player, and the like.

SUMMARY

The present disclosure has been made in an effort to solve the above-described problems associated with the prior art, and provides a semiconductor memory device, which is capable of selectively operating a plurality of cell strings sharing a drain select line during an operation of the semiconductor memory device, and an operating method thereof.

The present disclosure has also been made in an effort to solve the above-described problems associated with the prior art, and provides a semiconductor memory device, including: a memory cell array including a plurality of memory blocks sharing one or more drain select lines; a peripheral circuit configured to perform a program operation on the memory cell array; and a control logic configured to control the peripheral circuit to coding-program one or more drain select transistors included in each of the plurality of memory blocks.

An exemplary embodiment of the present disclosure provides a semiconductor memory device, including: a memory cell array including a plurality of memory blocks sharing a bit line, a common source line, and one or more drain select lines; a peripheral circuit configured to perform a program operation on the memory cell array; and a control logic configured to control the peripheral circuit to coding-program one or more drain select transistors included in each of the plurality of memory blocks, in which each of the plurality of memory blocks includes one or more connection control transistors serially connected between a bit line and a common source line, one or more drain select transistors, a plurality of memory cells, and a source select transistor.

Still another exemplary embodiment of the present disclosure provides a method of operating a semiconductor memory device, the method including: providing a memory cell array including a plurality of memory blocks sharing a bit line, a common source line, and one or more drain select lines; programming one or more connection control transistors included in the plurality of memory blocks; and programming one or more drain select transistors included in each of the plurality of memory blocks in such a manner that the one or more drain select transistors are coding-programmed so that the plurality of memory blocks has different coding data, respectively.

According to the exemplary embodiment of the present disclosure, the semiconductor memory device is designed so that the plurality of strings of the semiconductor memory device shares a drain select line, thereby decreasing an area of a memory cell array, and it is possible to skip a process for separating the drain select lines, thereby improving a manufacturing process.

BRIEF DESCRIPTION OF THE DRAWINGS

Various examplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Throughout this specification and the claims that follow, when it is described that an element is "coupled" to another element, the element may be "directly coupled" to the other element or "electrically coupled" to the other element through a third element.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
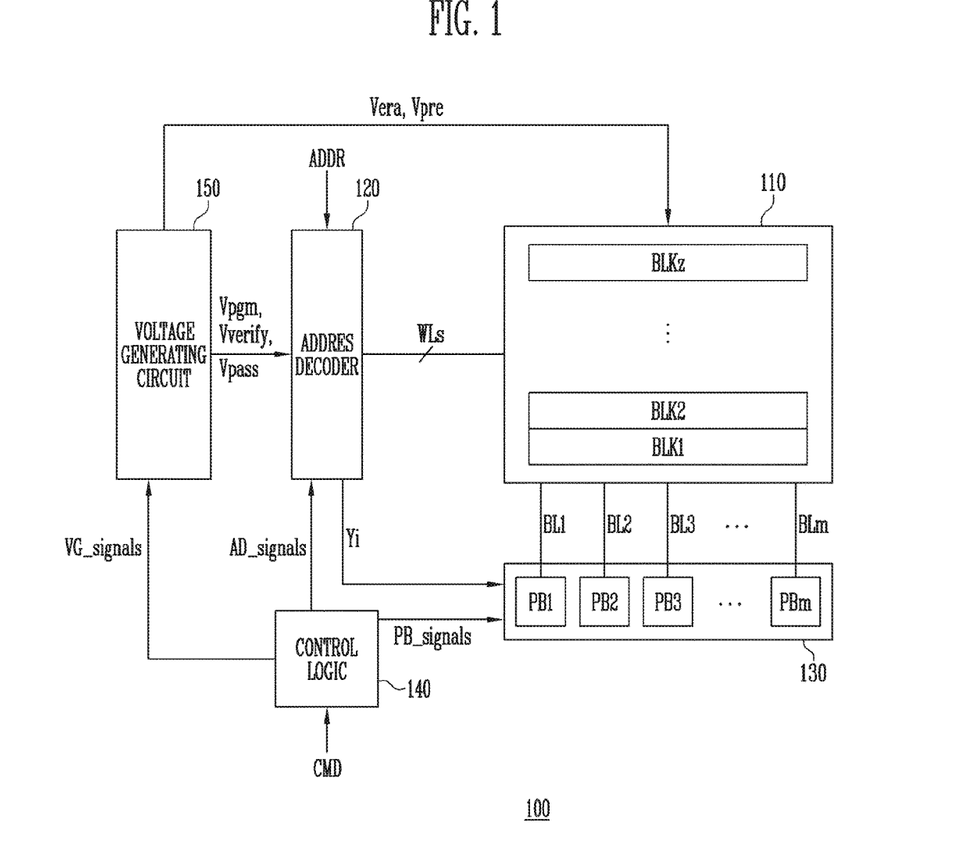
FIG. 1 is a block diagram illustrating a semiconductor memory device according to an exemplary embodiment of the present disclosure.

FIG. 1 is a block diagram illustrating a semiconductor memory device 100 according to an exemplary embodiment of the present disclosure.

Referring to FIG. 1, the semiconductor memory device 100 may include a memory cell array 110, an address decoder 120, a read and write circuit 130, a control logic 140, and a voltage generating circuit 150.

The address decoder 120, the read and write circuit 130, and the voltage generating circuit 150 may be defined as peripheral circuits that perform general operations, such as a program operation, an erase check operation, and a read operation, on the memory cell array 110. Further, the address decoder 120, the read and write circuit 130, and the voltage generating circuit 150 may be defined as peripheral circuits that perform a program operation of a connection control transistor and a drain select transistor included in the memory cell array 110.

The memory cell array 110 may include a plurality of memory blocks BLK1 to BLKz. The plurality of memory blocks BLK1 to BLKz is connected to an address decoder 120 through word lines WLs. The plurality of memory blocks BLK1 to BLKz is connected to the read and write circuit 130 through bit lines BL1 to BLm. In this exemplary embodiment, the plurality of memory cells may be nonvolatile memory cells based on a charge trap device. The plurality of memory cells which is commonly connected to the same word line may be defined as one page. The memory cell array 110 is formed of a plurality of pages.

A detailed configuration of the memory cell array 110 will be described later.

The address decoder 120 is connected to the memory cell array 110 through the word lines WLs. The address decoder 120 may operate in response to control signals AD_signals output from the control logic 140. The address decoder 120 receives an address ADDR through an input/output buffer (not illustrated) of the semiconductor memory device 100. The address decoder 120 applies a program voltage Vpgm to a selected word line among the word lines WLs and applies a pass voltage Vpass to the non-selected word lines according to the received address during a program operation. Further, during a program verify operation, the address decoder 120 applies a verify voltage Vverify to a selected word line and applies a pass voltage Vpass to the non-selected word lines.

The address decoder 120 may apply a program voltage Vpgm to a connection control line connected to the connection control transistor during the program operation of the connection control transistor of the memory cell array, and may apply a program voltage Vpgm to a drain select line connected to the drain select transistor during the program operation of the drain select transistor.

Further, the address ADDR received during various general operations including a program operation, a read operation, and an erase operation of the semiconductor memory device 100 may include a block address, a row address, and a column address. The address decoder 120 selects one memory block and one word line according to the block address and the row address. A column address Yi is decoded by the address decoder 120 and is provided to the read and write circuit 130.

The address decoder 120 may include a block decoder, a row decoder, a column decoder, an address buffer, and the like.

The read and write circuit 130 may include a plurality of page buffers PB1 to PBm. The plurality of page buffers PB1 to PBm is connected to the memory cell array 110 through the bit lines BL1 to BLm. The plurality of page buffers PB1 to PBm may adjust potential levels of the corresponding bit lines BL1 to BLm according to data to be programmed during the program operation, respectively. Further, the plurality of page buffers PB1 to PBm precharges the potential levels of the bit lines BL1 to BLm to predetermined levels, respectively, and senses the potential levels or the current quantities of the bit lines BL1 to BLm to determine whether the program operation passes or fails during a program verify operation.

The read and write circuit 130 may operate in response to control signals PB_signals output from the control logic 140.

The control logic 140 is connected to the address decoder 120, the read and write circuit 130, and the voltage generating circuit 150. The control logic 140 receives a command CMD through the input/output buffer (not illustrated) of the semiconductor memory device 100. The control logic 140 may control various general operations including the program operation, the read operation, and the erase operation of the semiconductor memory device 100, and the program operations of the connection control transistor and the drain select transistor in response to the command CMD.

Further, the control logic 140 may control the address decoder 120, the read and write circuit 130, and the voltage generating circuit 150 in order to code-program the drain select transistors included in two or more memory blocks sharing the drain select lines among the plurality of memory blocks BLK1 to BLKz included in the memory cell array 110. The coding program may be programmed so that the plurality of memory blocks corresponds to different coding data.

The control logic 140 may generate and output control signals AD_signals for controlling the address decoder 120, control signals PB_signals for controlling the read and write circuit 130, and control signals VG_signals for controlling the voltage generating circuit 150, in response to the command CMD.

When the command CMD corresponding to the program operations of the connection control transistor and the drain select transistor is received, the control logic 140 may control the peripheral circuit so that the connection control transistors are programmed to have a predetermined level of threshold voltage value, and the drain select transistors of the plurality of cell strings sharing the bit line are selectively programmed by using on/off characteristics of the programmed connection control transistors.

The voltage generating circuit 150 may operate in response to control signals VG_signals output from the control logic 140.

The voltage generating circuit 150 may generate and output a program voltage Vpgm and a pass voltage Vpass during a program operation, generate and output a verify voltage Vverify and the pass voltage Vpass during a verify operation, and generate and output an erase voltage Vera during an erase operation. Further, the voltage generating circuit 150 may apply the precharge voltage Vpre to a common source line of the memory cell array 110 and precharge a channel of the selected cell string to a predetermined level during the program operation of the drain select transistor. Further, the voltage generating circuit 140 may apply the erase voltage Vera to the common source line of the memory cell array 100 and perform an erase operation during the erase operation.

Figure 2:
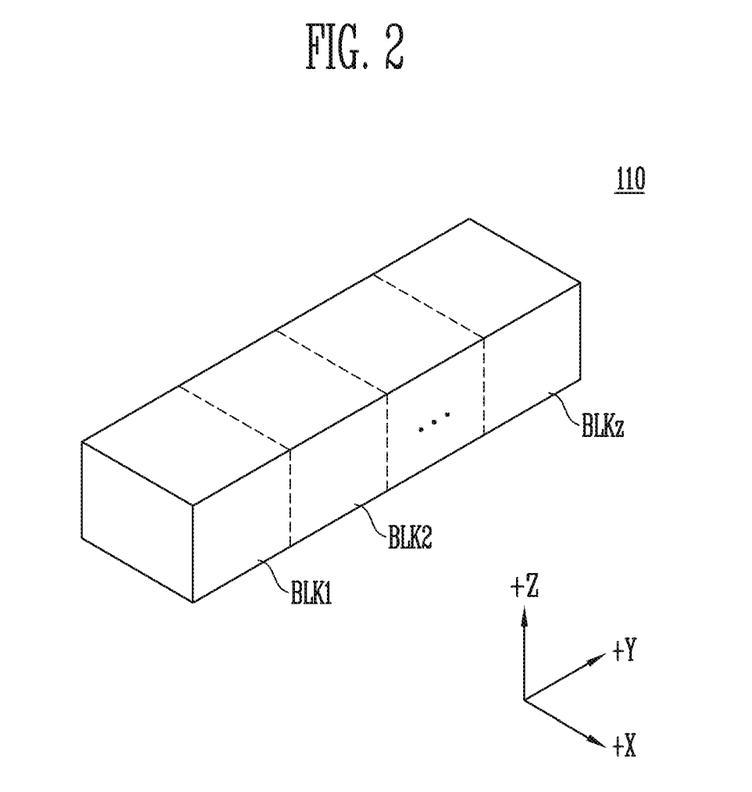
FIG. 2 is a block diagram illustrating an exemplary embodiment of a memory cell array of FIG. 1.

FIG. 2 is a block diagram illustrating an exemplary embodiment of the memory cell array 110 of FIG. 1.

Referring to FIG. 2, the memory cell array 110 may include the plurality of memory blocks BLK1 to BLKz. Each of the memory blocks may have a two-dimensional (2D) or a three-dimensional (3D) structure. Each of the memory blocks may include the plurality of memory cells stacked on a substrate. When the memory blocks have a 3D structure, as shown in FIG. 2, the memory cell array 110 may include a plurality of memory blocks BLK1 to BLKz each having a 3D structure (or vertical structure). The plurality of memory cells is arranged in a +X-axis direction, a +Y-axis direction, and a +Z-axis direction. A structure of each of the memory blocks will be described in more detail with reference to FIG. 3.

Figure 3:
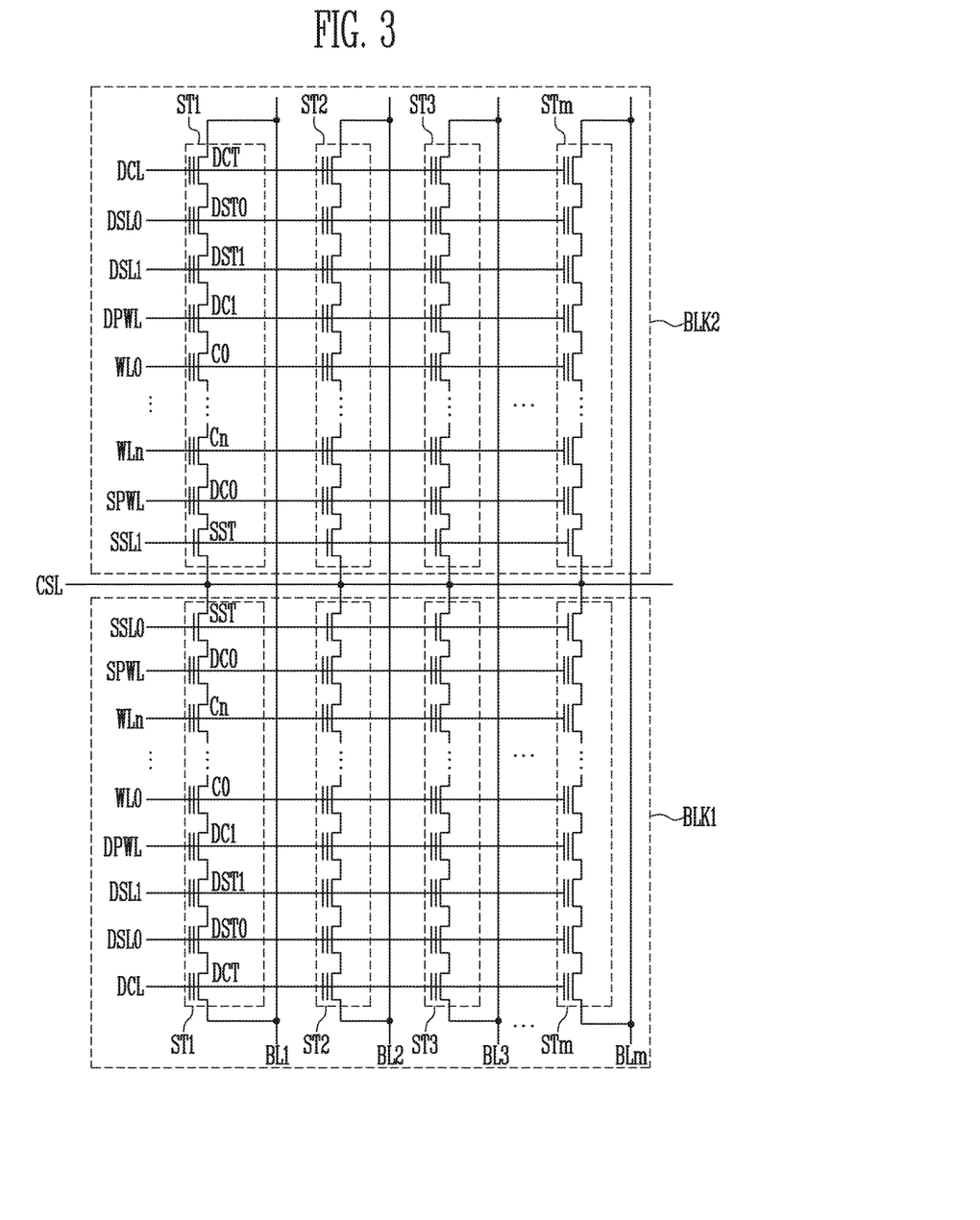
FIG. 3 is a circuit diagram illustrating a detailed configuration of the memory blocks of FIG. 1.

FIG. 3 is a circuit diagram illustrating the memory blocks BLK1 to BLKz of FIG. 1.

In FIG. 1, it is illustrated that the plurality of memory blocks BLK1 to BLKz is connected to the read and write circuit 130 through the bit lines BL1 to BLm. However, for the purposes of illustration and the sake of convenience, only the memory block BLK1 and the memory block BLK2 are representatively illustrated in FIG. 3. The memory block BLK1 and the memory block BLK2 have structures sharing the bit lines BL1 to BLm and a common source line CSL. Further, the memory block BLK1 and the memory block BLK2 has the structures sharing the plurality of word lines WL0 to WLn, first and second drain select lines DSL0 and DSL1, a connection control line DCL, a drain dummy line DPWL, and a source dummy line SPWL.

Referring to FIG. 3, the memory block BLK1 and the memory block BLK2 are connected to the plurality of bit lines BL1 to BLm.

The memory block BLK1 may include a plurality of cell strings ST1 to STm. The plurality of cell strings ST1 to STm are connected between the plurality of bit lines BL1 to BLm and the common source line CSL, respectively. Each of the plurality of cell strings ST1 to STm may include a source select transistor SST, one or more source dummy cells DC0, the plurality of serially connected memory cells C0 to Cn, one or more drain dummy cells DC1, two or more drain select transistors DST0 and DST1, and one or more connection control transistors DCT.

The source select transistor SST is connected to a source select line SSL0, and the one or more source dummy cells DC0 are connected to a source dummy line SPWL. The plurality of memory cells C0 to Cn are connected to the word lines WL0 to WLn, respectively. The one or more drain dummy cells DC1 are connected to the drain dummy line DPWL, and the two or more drain select transistors DST0 and DST1 are respectively connected to the first and second drain select lines DSL0 and DSL1. The one or more connection control transistors DCT are connected to the connection control line DCL.

The memory block BLK2 may be formed in a similar structure to that of the memory block BLK1. That is, the memory block BLK2 may include the plurality of strings ST1 to STm, and the plurality of strings ST1 to STm are connected between the plurality of bit lines BL1 to BLm and the common source line CSL, respectively. Each of the plurality of cell strings ST1 to STm may include a source select transistor SST, one or more source dummy cells DC0, the plurality of serially connected memory cells C0 to Cn, one or more drain dummy cells DC1, two or more drain select transistors DST0 and DST1, and one or more connection control transistors DCT.

The source select transistor SST is connected to a source select line SSL1, and the one or more source dummy cells DC0 are connected to the source dummy line SPWL. The plurality of memory cells C0 to Cn are connected to the word lines WL0 to WLn, respectively. The one or more drain dummy cells DC1 are connected to the drain dummy line DPWL, and the two or more drain select transistors DST0 and DST1 are respectively connected to the first and second drain select lines DSL0 and DSL1. The one or more connection control transistors DCT are connected to the connection control line DCL.

As described above, the memory block BLK1 and the memory block BLK2 may have similar structures, in which the plurality of word lines WL0 to WLn, the source and drain dummy lines SPWL and DPWL, the first and second drain select lines DLS0 and DSL1, and the connection control line DCL are shared, and only the source select lines SSL0 and SSL1 connected to the source select transistor are electrically separated.

In the exemplary embodiment of the present disclosure, two or more memory blocks among the plurality of memory blocks BLK1 included in the memory cell array 110 may be defined as one group and share the drain select line. For example, when two memory blocks are defined as one memory block group, the drain select transistor is coding-programmed so that each of the memory blocks has coding data of one bit. When four memory blocks are defined as one memory block group, the drain select transistor is coding-programmed so that each of the memory blocks has coding data of two bits. When eight memory blocks are defined as one memory block group, the drain select transistor is coding-programmed so that each of the memory blocks has coding data of three bits. That is, the drain select transistors are coding-programmed so that the plurality of memory blocks included in the memory block group sharing the drain select lines corresponds to different coding data. Further, when two memory blocks are defined as one group, the drain select transistor is coding-programmed so that each of the memory blocks includes one drain select transistor and has coding data of one bit. When four memory blocks are defined as one group, the two drain select transistors are coding-programmed so that each of the memory blocks includes the two drain select transistors and has coding data of two bits. Further, when eight memory blocks are defined as one group, the three drain select transistors are coding-programmed so that each of the memory blocks includes the three drain select transistors and has coding data of three bits.

The coding program operation of the drain select transistors of each memory block will be described below.

Figure 4:
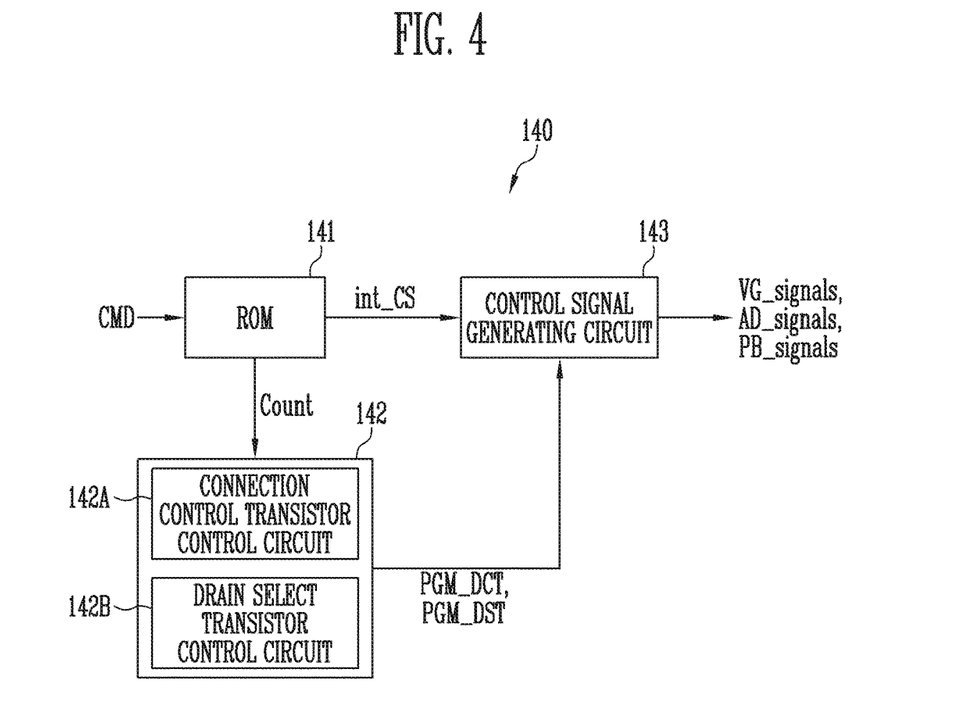
FIG. 4 is a block diagram illustrating a control logic of FIG. 1.

FIG. 4 is a block diagram illustrating the control logic 140 of FIG. 1.

Referring to FIG. 4, the control logic 140 may include a ROM 141, a program operation selecting circuit 142, and a control signal generating circuit 143.

An algorithm for performing various operations (a program operation, a read operation, an erase operation, the program operations of the connection control transistor and the drain select transistor, and the like) of the semiconductor memory device may be stored in the ROM 141. For example, the ROM 141 may output an internal control signal int_CS to the control signal generating circuit 143 and a count signal Count to the program operation selecting circuit 142 in response to a command CMD input from a host Host connected to the semiconductor memory device.

The program operation selecting circuit 142 may generate and output a connection control transistor program signal PGM_DCT or a drain select transistor program signal PGM_DST in response to the count signal Count received from ROM 141.

The program operation selecting circuit may include a connection control transistor control circuit 142A and a drain select transistor control circuit 142B. The connection control transistor control circuit 142A may generate and output a connection control transistor program signal PGM_DCT in response to the count signal Count, and the drain select transistor control signal 142B may generate and output a drain select transistor program signal PGM_DST in response to the count signal Count. For example, the program operation selecting circuit 142 first generates and outputs the connection control transistor program signal PGM_DCT in response to the count signal Count. After the program operation of the connection control transistor is completed, the drain select transistor control signal 142B generates and outputs the drain select transistor program signal PGM_DST in response to the count signal Count.

The control signal generating circuit 143 may output the plurality of control signals VG_signals, AD_signals, and PB_signals for controlling the peripheral circuits (the voltage generating circuit 150, the address decoder 120, and the read and write circuit 130 of FIG. 1) in response to the internal control signal int_CS, the connection control transistor program signal PGM_DCT, and the drain select transistor program signal PGM_DST.

Figure 5:
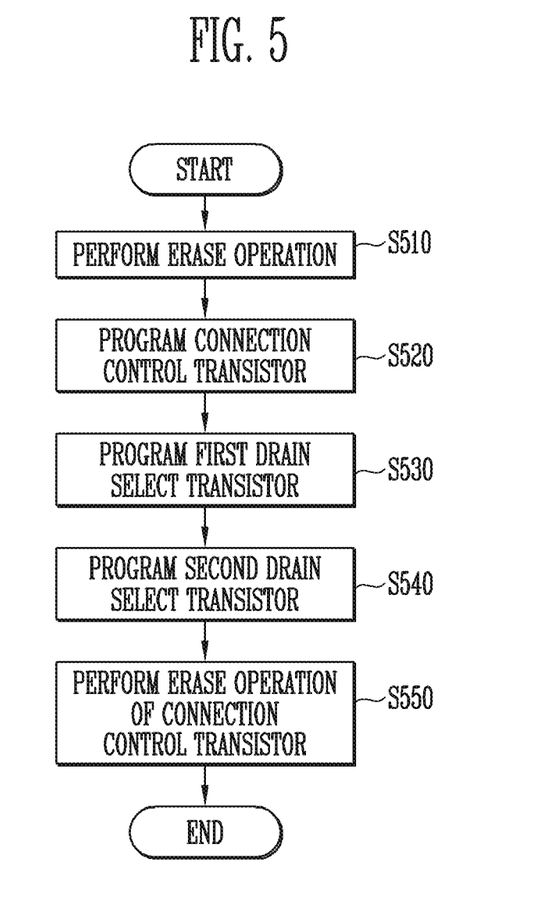
FIG. 5 is a flowchart describing an operation of the semiconductor memory device according to an exemplary embodiment of the present disclosure.

FIG. 5 is a flowchart describing an operation of the semiconductor memory device 100 according to an exemplary embodiment of the present disclosure.

Table 1 below is a table representing an application of a bias in an operating method of the semiconductor memory device 100 according to the present disclosure.

TABLE 1

|  |  | BL | DCL | DSL | | WLs | SSL | | CSL |
|  |  |  |  | DSL0 | DSL1 |  | SSL0 | SSL1 |  |
| --- | --- | --- | --- | --- | --- | --- | --- | --- | --- |
| DCT program |  | 0 V | Vpgm (ISPP) | Vpass | Vpass | 0 V | 0 V | 0 V | 0 V |
| DST0 PGM | PGM | Vdc | 0 V | Vpgm (ISPP) | Vpass | Vpass | Vpass | 0 V | 0 V |
|  | Vverify | 0.5 V | Vpass | Vverify | Vpass | Vpass | Vpass | 0 V | 0 V |
| DST1 PGM | PGM | Vdc | 0 V | 0 V | Vpgm (ISPP) | Vpass | 0 V | Vpass | 0 V |
|  | Vverify | 0.5 V | Vpass | Vpass | Vverify | Vpass | 0 V | Vpass | 0 V |

The operating method of the semiconductor memory device 100 according to an exemplary embodiment of the present disclosure will be described below with reference to FIGS. 1 to 5, and Table 1.

In an exemplary embodiment of the present disclosure, the structure, in which four memory blocks among the plurality of memory blocks BLK1 to BLKz included in the memory cell array 110 share the drain select lines DSL0 and DSL1, is described as an example, and thus, the first and second drain select transistors DST0 and DST1 are programmed so that the four memory blocks correspond to different coding data, respectively.

At step S510, an erase operation is performed on the memory cells C0 to Cn included in a selected memory block (for example, BLK1). In the exemplary embodiment of the present disclosure, it is described that only the selected memory block is erased, but the present disclosure is not limited thereto, and all of the plurality of memory blocks BLK1 to BLKz included in the memory cell array 110 may be erased or one or more memory blocks may be erased.

The voltage generating circuit 150 may generate an erase voltage Vera in response to control signals VG_signals and apply the generated erase voltage Vera to the common source line CSL of the memory cell array 110.

The address decoder 120 may control the word lines WL0 to WLn of the selected memory block BLK1 to be in a floating state, and apply a select line voltage (for example, a ground voltage, 0V) to each of the drain select lines DSL0 and DSL1 and the source select line SSL0, in response to the control signals AD_signals. Accordingly, a gate induced drain leakage (GIDL) current is generated in a lower channel of the source select transistor SST of the selected memory block BLK1 by the erase voltage Vera applied through the common source line CSL, and hot holes generated in the GIDL current are supplied to a channel layer of the plurality of cell strings ST1 to STm. When the potential levels of the word lines WL0 to WLn are discharged to a ground voltage level, a voltage difference between the channels of the word lines WL0 to WLn and the cell strings ST1 to STm is increased to be sufficiently large and electrons trapped in charge storing layers of the memory cells C0 to Cn included in the selected memory block BLK1 are discharged to the channel, so that threshold voltages of the memory cells C0 to Cn are decreased, and thus the memory cells C0 to Cn are erased.

During the erase operation, the memory cells C0 to Cn, the drain select transistors DST0 and DST1, and the connection control transistor DCT may be erased together. The erase operations of the drain select transistors DST0 and DST1, and the connection control transistor DCT may be performed together with the erase operation of the memory cells C0 to Cn. That is, the threshold voltages of the drain select transistors DST0 and DST1 and the connection control transistor DCT may be controlled to be in the erase state by applying the erase voltage Vera to the common source line CSL and discharging the connection control line DCL and the drain select lines DSL0 and DSL1 to the ground voltage level in the floating state.

The present exemplary embodiment is based on the erase operation using the GIDL scheme as an example, but the present disclosure is not limited thereto, and is applicable to all of the erase operations for erasing the memory cells of the semiconductor memory device. For example, the present disclosure is also applicable to an erase operation of erasing data stored in the memory cells by an FN tunneling scheme by applying an erase voltage having a high potential level to the source line. For example, data stored in the memory cells is erased by an FN tunneling scheme by applying an erase voltage having a high potential level to the source line.

At step S520, a program operation of the connection control transistor DCT is performed.

The voltage generating circuit 150 may generate a program voltage Vpgm and a pass voltage Vpass in response to the control signals VG_signals, and the address decoder 120 may apply the program voltage Vpgm to the connection control line DCL and apply the pass voltage Vpass to the first and second drain select line DSL0 and DSL1 in response to the control signals AD_signals. Further, the address decoder 120 may apply a ground voltage (0 V) to the source select lines SSL0 and SSL1 and the word lines WL0 to WLn in response to the control signals AD_signals. In this case, the program voltage Vpgm applied to the connection control line DCL may be a program voltage in an incremental Step Pulse Program (ISPP) scheme.

In this case, the read and write circuit 130 may apply a program allowable voltage (0 V) in response to the control signals PB_signals.

Accordingly, the connection control transistors DCTs included in the plurality of memory blocks of the memory cell array 110 may be programmed to have a threshold voltage distribution having a predetermined level or more. In this case, the threshold voltage may be at least 1 V or more.

In the program operation of the connection control transistor DCT, a program verify operation may be performed after the operation of applying the program voltage Vpgm, but the program operation of the connection control transistor DST is not the program operation requiring a precise threshold voltage, so a program verify operation may be skipped after the program voltage Vpgm is applied by the predetermined number of times.

The program operation of the connection control transistor DCT may be simultaneously performed on the plurality of memory blocks sharing the connection control line and the drain select lines.

Then, a coding program operation of the first drain select transistor DST0 and the second drain select transistor DST1 of the selected memory block (for example, BLK1) may be performed. That is, the selected memory block BLK1 may correspond to the predetermined coding data by programming the first drain select transistor DST0 and the second drain select transistor DST1. For example, in the exemplary embodiment of the present disclosure, a method of coding-programming the first drain select transistor DST0 and the second drain select transistor DST1 to correspond with the memory block BLK1 to data "00" will be described.

At step S530, the program operation of the first drain select transistor DST0 of the selected memory block (for example, BLK1) may be performed.

The voltage generating circuit 150 may generate a precharge voltage Vpre in response to the control signals VG_signals and apply the generated precharge voltage Vpre to the common source line CSL. The address decoder 120 may apply the pass voltage Vpass to the source select lines SSL0 and SSL1 of the plurality of memory blocks BLK1 to BLKm in response to the control signals AD_signals and turns on the source select lines SSL0 and SSL1 of the plurality of memory blocks BLK1 to BLKm. Accordingly, the channels of the cell strings ST1 to STm included in the plurality of memory blocks BLK1 to BLKm are precharged to a predetermined level or more.

Then, the voltage generating circuit 150 may generate the program voltage Vpgm and the pass voltage Vpass in response to the control signals VG_signals, and discharge the potential level of the common source line CSL to 0 V. The address decoder 120 may apply the pass voltage Vpass to the source select line SSL0, the second drain select line DSL1, and the word lines WL0 to WLn of the selected memory block BLK1, and apply the ground voltage (0 V) to the source select line SSL1 of the non-selected memory block BLK2 in response to the control signals AD_signals. Accordingly, the channels of the cell strings ST1 to STm Included in the selected memory block BLK1 are discharged to the potential level of 0 V, and the channels of the cell strings ST1 to STm included in the non-selected memory block BLK2 are channel-boosted to a predetermined potential level or more by the pass voltage Vpass applied to the word lines WL0 to WLn.

Then, the address decoder 120 may apply the program voltage Vpgm to the first drain select line DSL0 in response to the control signals AD_signals and program the first drain select transistor DST0. The program voltage may be a program voltage of the ISPP scheme.

The program voltage Vpgm may also be applied to the first drain select line DSL0 of the non-selected memory block BLK2, but the potential level of the channel is in the boosting state, so the first drain select transistor DST0 of the non-selected memory block BLK2 is not programmed.

In this case, the read and write circuit 130 may apply a power voltage Vdc to the bit lines BL1 to BLm in response to the control signals PB_signals.

Then, it is verified whether the first drain select transistor DST0 has a threshold voltage having a predetermined level or more by performing a program verify operation.

During the program verify operation, the read and write circuit 130 may precharge the potential levels of the bit lines BL1 to BLm to a predetermined level (for example, 0.5 V) in response to the control signals PB_signals, and the voltage generating circuit 150 may generate a verify voltage Vverify and the pass voltage Vpass in response to the control signals VG_signals. The address decoder 120 may apply the verify voltage Vverify to the first drain select line DSL0, and apply the pass voltage Vpass to the connection control line DCL, the source select line SSL0, the second drain select line DSL1, and the word lines WL0 to WLn in response to the control signals AD_signals. The read and write circuit 130 may sense a change in a potential level or the quantity of current of the bit lines BL1 to BLm and perform a program verify operation. When it is determined that the program operation is failed as a result of the program verify operation, the program operation is performed again by increasing the program voltage Vpgm by a step voltage.

At step S540, when it is determined that the program operation has passed as the result of the program verify operation, the program operation of the second drain select transistor DST1 may be performed.

The voltage generating circuit 150 may generate a precharge voltage Vpre in response to the control signals VG_signals and apply the generated precharge voltage Vpre to the common source line CSL. The address decoder 120 applies the pass voltage Vpass to the source select lines SSL0 and SSL1 of the plurality of memory blocks BLK1 to BLKm in response to the control signals AD_signals and turn on the source select lines SSL0 and SSL1 of the plurality of memory blocks BLK1 to BLKm. Accordingly, the channels of the cell strings ST1 to STm included in the plurality of memory blocks BLK1 to BLKm are precharged to a predetermined level or more.

Then, the voltage generating circuit 150 may generate the program voltage Vpgm and the pass voltage Vpass in response to the control signals VG_signals, and discharge the potential level of the common source line CSL to 0 V. The address decoder 120 may apply the pass voltage Vpass to the source select line SSL0, the first drain select line DSL0, and the word lines WL0 to WLn of the selected memory block BLK1, and apply the ground voltage (0 V) to the source select line SSL1 of the non-selected memory block BLK2 in response to the control signals AD_signals. Accordingly, the channels of the cell strings ST1 to STm included in the selected memory block BLK1 are discharged to the potential level of 0 V, and the channels of the cell strings ST1 to STm included in the non-selected memory block BLK2 are channel-boosted to a predetermined potential level or more by the pass voltage Vpass applied to the word lines WL0 to WLn.

Then, the address decoder 120 may apply the program voltage Vpgm to the second drain select line DSL1 in response to the control signals AD_signals and programs the second drain select transistor DST1. The program voltage may be a program voltage of the ISPP scheme.

The program voltage Vpgm may also be applied to the second drain select line DSL1 of the non-selected memory block BLK2, but the potential level of the channel is in the boosting state, so the second drain select transistor DST1 of the non-selected memory block BLK2 is not programmed.

In this case, the read and write circuit 130 may apply the power voltage Vdc to the bit lines BL1 to BLm in response to the control signals PB_signals.

Then, it is verified whether the second drain select transistor DST2 has a threshold voltage having a predetermined level or more by performing the program verify operation.

During the program verify operation, the read and write circuit 130 may precharge the potential levels of the bit lines BL1 to BLm to a predetermined level (for example, 0.5 V) in response to the control signals PB_signals, and the voltage generating circuit 150 may generate the verify voltage Vverify and the pass voltage Vpass in response to the control signals VG_signals. The address decoder 120 may apply the verify voltage Vverify to the second drain select line DSL1, and apply the pass voltage Vpass to the connection control line DCL, the source select line SSL0, the first drain select line DSL0, and the word lines WL0 to WLn in response to the control signals AD_signals. The read and write circuit 130 may sense a change in a potential level or the quantity of current of the bit lines BL1 to BLm and perform the program verify operation. When it is determined that the program operation is failed as a result of the program verify operation, the program operation is performed again by increasing the program voltage Vpgm by a step voltage.

When it is determined that the program operation has passed as the result of the program verify operation of the second drain select transistor DST1, the program operations of the first and second drain select transistors DST0 and DST1 are performed by selecting a next memory block. In this case, the first and second drain select transistors DST0 and DST1 may be programmed so that the next memory block corresponds to different coding data from that of the previous memory block. For example, the first and second drain select transistors DST0 and DST1 are programmed so that the next memory block corresponds to any one element of coding data among "01", "10", and "11".

In the foregoing exemplary embodiment, it is described that the memory block corresponds to data "0" when the first and second drain select transistors DST0 and DST1 have a predetermined threshold voltage or more, and that the memory block corresponds to data "1" when the first and second drain select transistors DST0 and DST1 have a threshold voltage lower than the predetermined threshold voltage (i.e., when the first and second drain select transistors DST0 and DST1 have an erase state).

That is, in the memory block corresponding to data "00", both the first and second drain select transistors DST0 and DST1 are programmed to have equal or higher threshold voltages than the predetermined threshold voltage. In the memory block corresponding to data "01", only the first drain select transistor DST0 is programmed to have equal or higher threshold voltages than the predetermined threshold voltage. In the memory block corresponding to data "10", only the second drain select transistor DST1 is programmed to have a higher threshold voltage than the predetermined threshold voltage. In the memory block corresponding to data "11", both the first and second drain select transistors DST0 and DST1 have a threshold voltage lower than the predetermined threshold voltage, and thus the program operation is not performed so that the first and second drain select transistors DST0 and DST1 maintain the erase state.

As described above, when the coding program operations of the first and second drain select transistors DST0 and DST1 of the four memory blocks included in the memory block group are terminated, the erase operations of the connection control transistors DCT are performed at step S550.

The erase operation of the connection control transistors DCT may be performed by an erase operation scheme in a unit of a page. For example, the erase voltage Vera is applied through the common source line and the bit lines BL1 to BLm are controlled to be in a floating state. Then, only the connection control transistor DCT is selectively erased by applying the pass voltage Vpass to the first and second drain select lines DSL0 and DSL1 and the plurality of word lines WL0 to WLn. In this case, a predetermined voltage lower than the erase voltage Vera may be applied to the source select lines SSL0 and SSL1.

In the exemplary embodiment of the present disclosure, it is described that the erase operation of the connection control transistors DCT are performed at step S550, but the present disclosure is not limited thereto. The process may be terminated such that the connection control transistors DCT have the program state without step S550 of the erase operation to the connection control transistors DCT.

As described above, according to the exemplary embodiment of the present disclosure, the drain select transistors may be programmed so that the plurality of memory blocks sharing the drain select lines has different coding data, respectively, and thus making it possible to selectively activate one memory block among the plurality of memory blocks by adjusting a voltage applied to the drain select line during the generation operation including the program operation, the read operation, and the erase operation.

Figure 6:
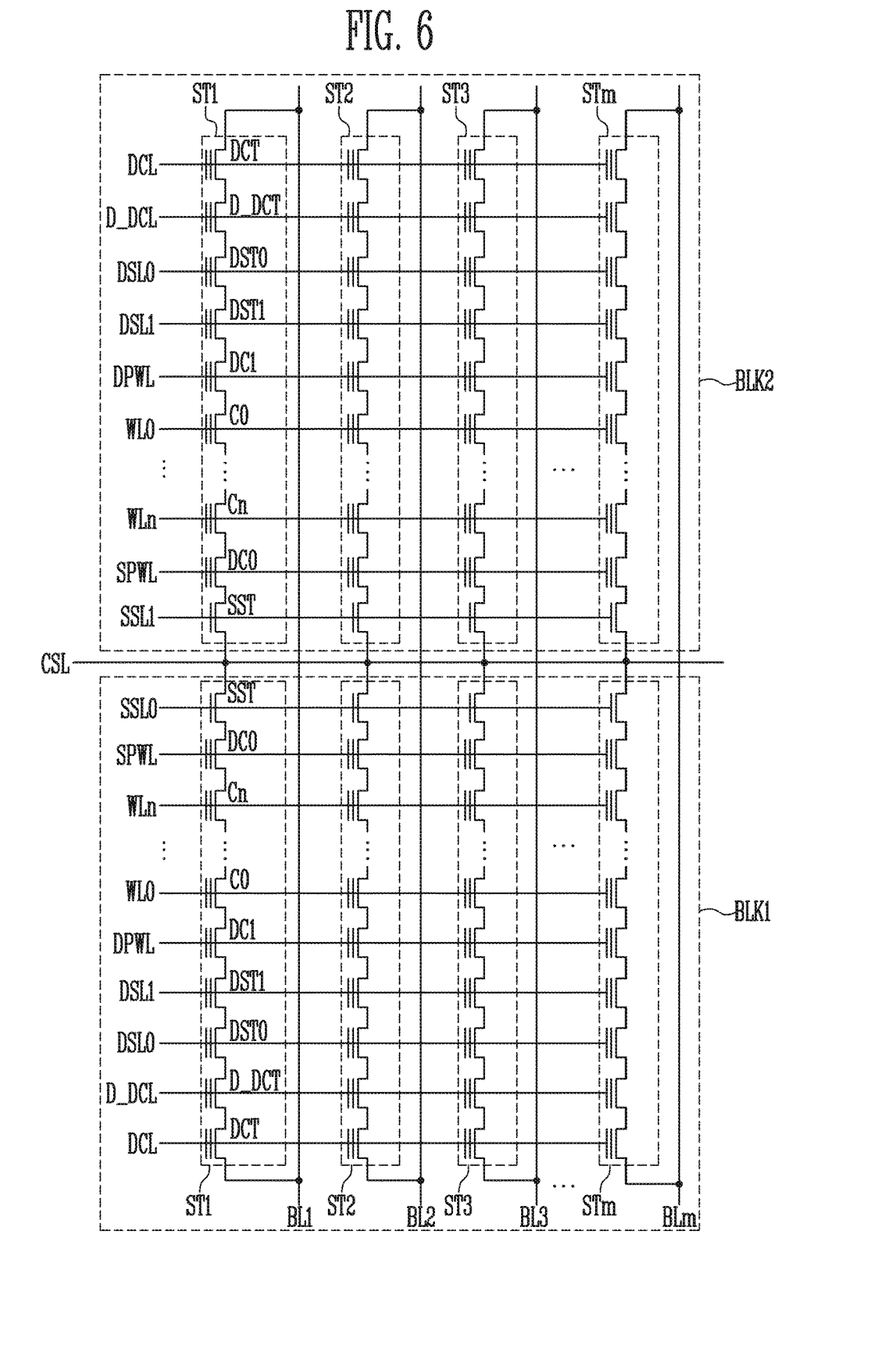
FIG. 6 is a circuit diagram illustrating a detailed configuration of the memory blocks of FIG. 1 according to another exemplary embodiment of the present disclosure.

FIG. 6 is a circuit diagram illustrating a detailed configuration of the memory blocks BLK1 to BLKz of FIG. 1 according to another exemplary embodiment of the present disclosure.

In FIG. 1, it is illustrated that the plurality of memory blocks BLK1 to BLKz is connected to the read and write circuit 130 through the bit lines BL1 to BLm, but in FIG. 6, for the purposes of illustration and for the sake of convenience, only the memory block BLK1 and the memory block BLK2 are representatively illustrated. The memory block BLK1 and the memory block BLK2 have structures sharing bit lines BL1 to BLm and a common source line CSL. Further, the memory block BLK1 and the memory block BLK2 may have the structures sharing the plurality of word lines WL0 to WLn, first and second drain select lines DSL0 and DSL1, a connection control line DCL, a drain dummy line DPWL, and a source dummy line SPWL.

Referring to FIG. 6, the memory block BLK1 and the memory block BLK2 are connected to the plurality of bit lines BL1 to BLm.

The memory block BLK1 may include a plurality of cell strings ST1 to STm. The plurality of cell strings ST1 to STm are connected between the plurality of bit lines BL1 to BLm and the common source line CSL, respectively. Each of the plurality of cell strings ST1 to STm may include a source select transistor SST, one or more source dummy cells DC0, the plurality of serially connected memory cells C0 to Cn, one or more drain dummy cells DC1, two or more drain select transistors DST0 and DST1, one or more dummy connection control transistors D_DCT, and one or more connection control transistors DCT.

The source select transistor SST is connected to a source select line SSL0, and the one or more source dummy cells DC0 are connected to a source dummy line SPWL. The plurality of memory cells C0 to Cn are connected to the word lines WL0 to WLn, respectively. The one or more drain dummy cells DC1 are connected to the drain dummy line DPWL, and the two or more drain select transistors DST0 and DST1 are connected to the first and second drain select lines DSL0 and DSL1. Further, the one or more dummy connection control transistors D_DCT are connected to the connection control line DCL, and the one or more connection control transistors DCT are connected to the connection control line DCL.

The memory block BLK2 may have a similar structure to that of the memory block BLK1. That is, the memory block BLK2 may include the plurality of strings ST1 to STm, and the plurality of strings ST1 to STm are connected between the plurality of bit lines BL1 to BLm and the common source line CSL, respectively. Each of the plurality of cell strings ST1 to STm may include a source select transistor SST, one or more source dummy cells DC0, the plurality of serially connected memory cells C0 to Cn, one or more drain dummy cells DC1, two or more drain select transistors DST0 and DST1, one or more dummy connection control transistors D_DCT, and one or more connection control transistors DCT.

The source select transistor SST is connected to a source select line SSL1, and the one or more source dummy cells DC0 are connected to the source dummy line SPWL. The plurality of memory cells C0 to Cn are connected to the word lines WL0 to WLn, respectively. The one or more drain dummy cells DC1 are connected to the drain dummy line DPWL, and the two or more drain select transistors DST0 and DST1 are connected to the first and second drain select lines DSL0 and DSL1. The one or more dummy connection control transistors D_DCT are connected to the dummy connection control line D_DCL, and the one or more connection control transistors DCT are connected to the connection control line DCL.

As described above, the memory block BLK1 and the memory block BLK2 may have similar structures, in which the plurality of word lines WL0 to WLn, the source and drain dummy lines SPWL and DPWL, the first and second drain select lines DLS0 and DSL1, and the connection control line DCL are shared, and only the source select lines SSL0 and SSL1 connected to the source select transistor are electrically separated.

Further, the detailed structure of the memory blocks according to FIG. 6 is different from that of the memory blocks according to FIG. 3 in that the dummy connection control transistor D_DCT connected to the dummy connection control line D_DCL is additionally disposed. The dummy connection control transistor D_DCT may be disposed between the connection control transistor DCT and the drain select transistor DST0 to stabilize an electric characteristic of the drain select transistor DST0. The dummy connection control transistor D_DCT maintains an erase state during the program operation of the connection control transistor DCT and the first and second drain select transistors DST0 and DST1.

Figure 7:
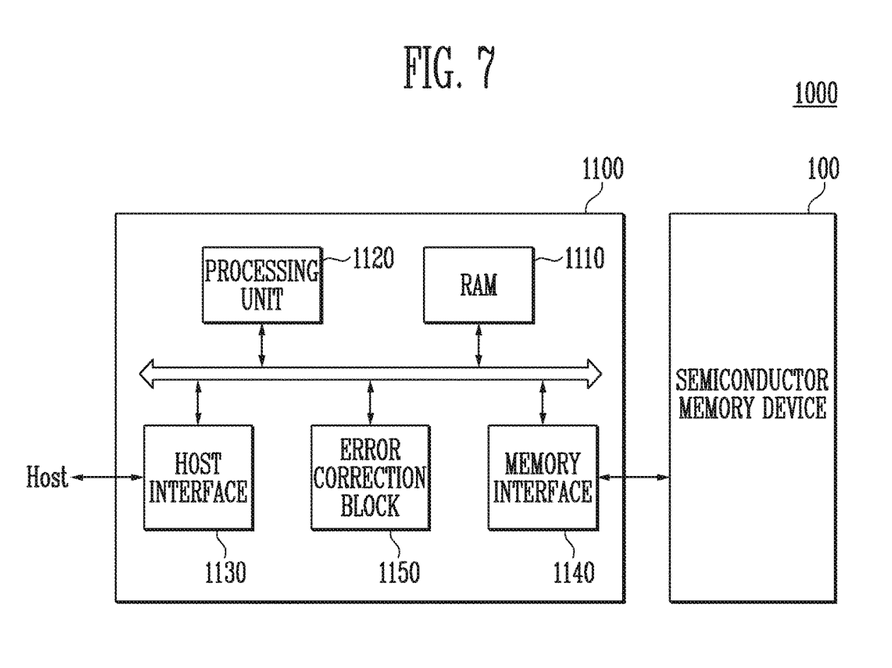
FIG. 7 is a block diagram illustrating a memory system including the semiconductor memory device of FIG. 1.

FIG. 7 is a block diagram illustrating a memory system 1000 including the semiconductor memory device 100 of FIG. 1.

Referring to FIG. 7, the memory system 1000 may include a semiconductor memory device 100 and a controller 1100.

The semiconductor memory device 100 may operate in a similar manner to that described with reference to FIG. 1. Hereinafter, overlapping descriptions will be omitted.

The controller 1100 is connected to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may drive firmware for controlling the semiconductor memory device 100.

The controller 1100 may include a Random Access Memory (RAM) 1110, a processing unit 1120, a host interface 1130, a memory interface 1140, and an error correction block 1150. The RAM 1110 is used as at least one among a working memory of the processing unit 1120, a cache memory between the semiconductor memory device 100 and the host Host, and a buffer memory between the semiconductor memory device 100 and the host Host. The processing unit 1120 controls a general operation of the controller 1100. Further, the controller 1100 may temporarily store program data provided from the host Host during the write operation.

The host interface 1130 may include a protocol to perform a data exchange between the host Host and the controller 1100. As an exemplified embodiment, the controller 1100 may communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 interfaces with the semiconductor memory device 100. For example, the memory interface includes a NAND interface or a NOR interface.

The error correction block 1150 may detect and correct an error of data received from the semiconductor memory device 100 by using an Error Correction Code (ECC). The processing unit 1120 may control the semiconductor memory device 100 to adjust a read voltage according to a result of the error detection of the error correction block 1150 and perform a re-read operation. As an exemplified embodiment, the error correction block may be provided as a constituent element of the controller 1100.

The controller 1100 and the semiconductor memory device 100 may be integrated into one semiconductor device. As an exemplified embodiment, the controller 1100 and the semiconductor memory device 100 may be integrated into one semiconductor device to configure a memory card. For example, the controller 1100 and the nonvolatile memory device 100 may be integrated as one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into one semiconductor device to configure a semiconductor drive (Solid State Drive (SSD)). The semiconductor drive (SSD) includes a storage device configured to store data in a semiconductor memory. In a case where the memory system 1000 is used as the SSD, a speed of the operation of the host Host connected to the memory system 1000 is remarkably improved.

For another example, the memory system 1000 is provided as one of various constituent elements of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensiona television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements devices configuring a computing system.

As an exemplified exemplary embodiment, the semiconductor memory device 100 or the memory system 1000 may be mounted in various types of package. For example, the semiconductor memory device 100 or the memory system 1000 may be packaged and embedded by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 8:
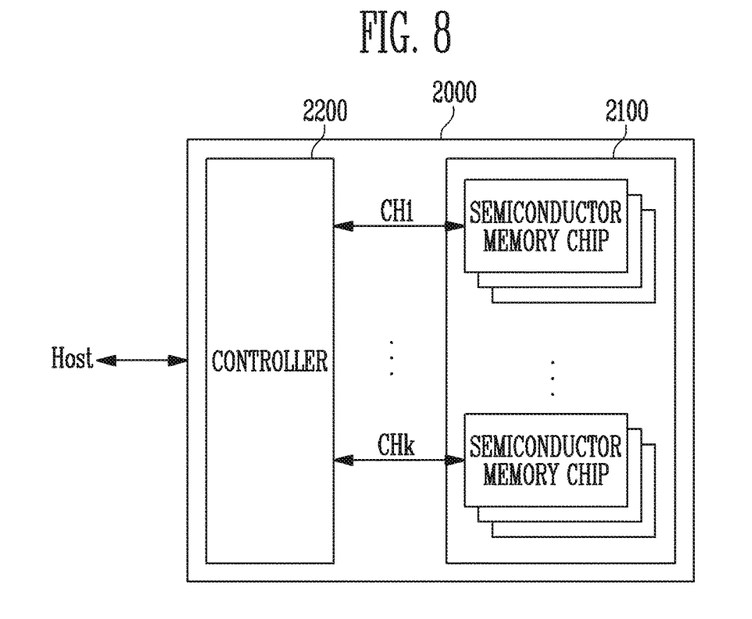
FIG. 8 is a block diagram illustrating an application example of the memory system of FIG. 7.

FIG. 8 is a block diagram illustrating an application example of the memory system of FIG. 7.

Referring to FIG. 8, a memory system 2000 includes a semiconductor memory device 2100 and a controller 2200. The semiconductor memory device 2100 includes a plurality of semiconductor memory chips. The plurality of semiconductor memory chips is divided into a plurality of groups.

In FIG. 8, it is illustrated that the plurality of groups communicates with the controller 2200 through first to $k^{th}$ channels CH1 to CHk, respectively. Each semiconductor memory chip may be configured and operated in a similar manner to that of one in the semiconductor memory device 100 described with reference to FIG. 1.

Each group may communicate with the controller 2200 through one common channel. The controller 2200 is configured in a similar manner to the controller 1100 described with reference to FIG. 7, and may control the plurality of memory chips of the semiconductor memory device 2100 through the plurality of channels CH1 to CHk.

Figure 9:
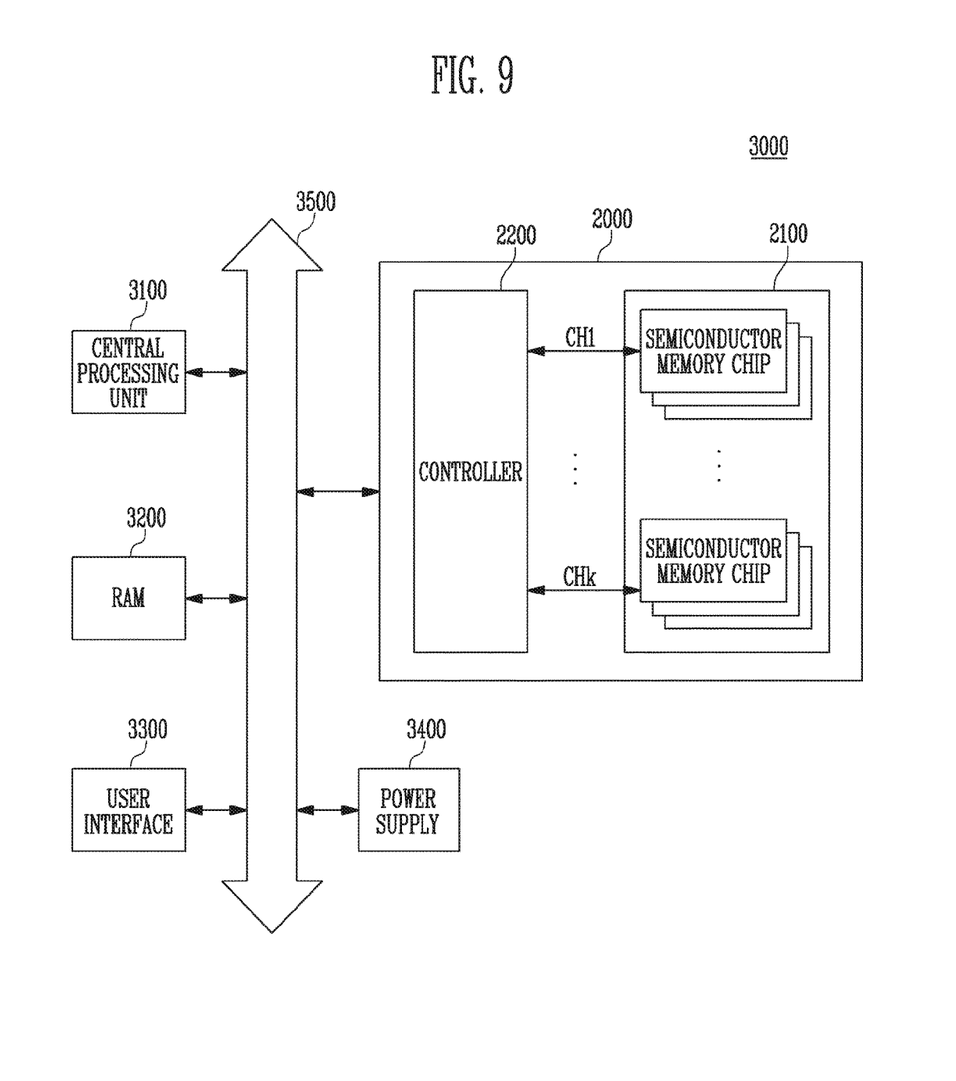
FIG. 9 is a block diagram illustrating a computing system including the memory system described with reference to FIG. 8.

FIG. 9 is a block diagram illustrating a computing system including the memory system described with reference to FIG. 8.

Referring to FIG. 9, a computing system 3000 includes a central processing unit 3100, a Random Access Memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 9, it is illustrated that the semiconductor memory device 2100 is connected to the system bus 3500 through the controller 2200. However, the semiconductor memory device 2100 may be configured to be directly connected to the system bus 3500. In this case, a function of the controller 2200 may be performed by the central processing unit 3100 and the RAM 3200.

In FIG. 9, it is illustrated that the memory system 2000 described with reference to FIG. 8 is provided. However, the memory system 2000 may be substituted with the memory system 1000 described with reference to FIG. 7. As an exemplified exemplary embodiment, the computing system 3000 may be configured to include all of the memory systems 1000 and 2000 described with reference to FIGS. 7 and 8.

The detailed description of the present disclosure includes the description of the particular exemplary embodiments, but various modification is available within the scope without departing from the scope and the technical spirit of the present disclosure. Therefore, the scope of the present disclosure shall not be limited to the exemplary embodiments described, but shall be defined by the claims to be described below and the equivalents to the claims.

What is claimed is:

1. A semiconductor memory device, comprising:
   at least two memory cell strings configured to share one or more drain select lines;
   a peripheral circuit configured to perform a program operation on a plurality of memory cells included in the at least two memory cell strings; and
   a control logic configured to control the peripheral circuit to perform a coding-program operation on one or more drain select transistors connected to the one or more drain select lines, respectively,
   wherein the one or more drain select transistors are programmed to have different threshold voltages according to the coding-program operation.

2. The semiconductor memory device of claim 1,
   wherein the peripheral circuit performs the program operation on the one or more drain select transistors to have different coding data, respectively.

3. The semiconductor memory device of claim 1,
   wherein each of the at least two memory cell string comprises a plurality of memory cells between the one or more drain select lines and one or more source select lines, and
   wherein each of the at least two memory cell strings includes one or more connection control transistors serially connected between a bit line and the one or more drain select transistors.

4. The semiconductor memory device of claim 3, wherein the at least two memory cell strings share a connection control line connected to the one or more connection control transistors.

5. The semiconductor memory device of claim 4,
   wherein the at least two memory cell strings include source select transistors connected to the electrically separated source select lines, respectively, and
   wherein the source select transistors are connected between the plurality of memory cells and a common source line.

6. The semiconductor memory device of claim 5, wherein the peripheral circuit programs the one or more connection control transistors before the coding-program operation is performed.

7. The semiconductor memory device of claim 6, wherein the peripheral circuit simultaneously programs the one or more connection control transistors by applying a program allowable voltage to the bit line and applying a program voltage to the one or more connection control transistors after turning off the source select transistors during the program operation of the one or more connection control transistors.

8. The semiconductor memory device of claim 5, wherein the peripheral circuit precharges a channel of the at least two memory cell strings through the common source line during the coding program operation.

9. The semiconductor memory device of claim 5, wherein the peripheral circuit programs performs the coding-program operation on the one or more drain select transistors by applying a ground voltage to the common source line, turning off the one or more connection control transistors, turning on the source select transistors, and then applying a program voltage to the drain select line during the coding program.

10. The semiconductor memory device of claim 9, wherein the peripheral circuit boosts a channel of a non-selected memory block by turning off the source select transistors of the non-selected memory block during the coding program operation.

11. A semiconductor memory device, comprising:
    a memory cell array configured to include a plurality of memory blocks sharing a bit line, a common source line, and one or more drain select lines;
    a peripheral circuit configured to perform a program operation on the memory cell array; and
    a control logic configured to control the peripheral circuit to perform a coding-program operation on one or more drain select transistors connected to the one or more drain select lines, respectively,
    wherein each of the plurality of memory blocks includes one or more connection control transistors, one or more drain select transistors, a plurality of memory cells, and a source select transistor, serially connected between a bit line and a common source line, and
    wherein the one or more drain select transistors are programmed to have different threshold voltages according to the coding-program operation.

12. The semiconductor memory device of claim 11, wherein each of the plurality of memory blocks further includes a dummy connection control transistor connected between the connection control transistor and the one or more drain select transistors.

13. The semiconductor memory device of claim 12,
wherein each of the plurality of memory blocks shares a connection control line connected to the one or more connection control transistors, a dummy connection control line connected to the one or more dummy connection control transistors, the one or more drain select lines connected to the one or more drain select transistors, and a plurality of word lines connected to the memory cells, and
wherein the source select transistors included in the plurality of memory blocks are connected to one of the electrically separated source select lines, respectively.

14. The semiconductor memory device of claim 11, wherein the peripheral circuit programs the one or more connection control transistors included in each of the plurality of memory blocks before coding-programs the one or more drain select transistors.

15. The semiconductor memory device of claim 11, wherein the peripheral circuit programs the one or more drain select transistors so that the one or more drain select transistors included in each of the plurality of memory blocks have different coding data, respectively.

16. A method of operating a semiconductor memory device, the semiconductor memory device including a memory cell array including a plurality of memory blocks sharing a bit line, a common source line, and one or more drain select lines, the method comprising:
programming one or more connection control transistors included in the plurality of memory blocks; and
programming one or more drain select transistors included in each of the plurality of memory blocks to have different threshold voltages.

17. The method of claim 16, wherein each of the plurality of memory blocks includes the one or more connection control transistors serially connected between the bit line and the common source line, the one or more drain select transistors, a plurality of memory cells, and a source select transistor.

18. The method of claim 17, wherein the programming of the one or more connection control transistors includes simultaneously programming the one or more connection control transistors included in the plurality of memory blocks by applying a program allowable voltage to the bit line, turning off the source select transistor, and then applying a program voltage to one or more connection control transistors.

19. The method of claim 16, wherein the coding-programming includes precharging a channel of the plurality of memory blocks through the common source line.

20. The method of claim 16, wherein the coding-programming includes programming the one or more drain select transistors by applying a ground voltage to the common source line after precharging the channel, turning off the one or more connection control transistors, and applying a program voltage to the drain select line after turning on the source select transistor of a selected memory block among the plurality of memory blocks.

* * * * *